United States Patent [19]

Toei et al.

[11] Patent Number: 5,200,025
[45] Date of Patent: Apr. 6, 1993

[54] METHOD OF FORMING SMALL THROUGH-HOLES IN THIN METAL PLATE

[75] Inventors: Keiji Toei; Yasuyoshi Miyaji; Masanobu Sato, all of Kyoto; Akihiro Inagaki, Shiga; Seiji Tonogai, Shiga; Koichi Omoto, Shiga, all of Japan

[73] Assignee: Dainippon Screen Manufacturing Co. Ltd., Japan

[21] Appl. No.: 762,587

[22] Filed: Sep. 19, 1991

[30] Foreign Application Priority Data

Sep. 20, 1990 [JP] Japan .................. 2-252763

[51] Int. Cl.$^5$ .................. B44C 1/22; C23F 1/00
[52] U.S. Cl. .................. 156/640; 156/644; 156/645; 156/651; 156/654; 156/661.1; 156/345
[58] Field of Search ............. 156/640, 644, 645, 651, 156/654, 656, 659.1, 661.1, 345

[56] References Cited

U.S. PATENT DOCUMENTS

| 4,303,466 | 12/1981 | Thoms | 156/644 X |
|---|---|---|---|
| 4,689,114 | 8/1987 | Ohtake et al. | 156/644 |
| 4,861,422 | 8/1989 | Kudo et al. | 156/640 |

FOREIGN PATENT DOCUMENTS

| 57-26345 | 6/1982 | Japan . |  |
|---|---|---|---|
| 59-73834 | 4/1984 | Japan . |  |
| 61-130492 | 6/1986 | Japan . |  |
| 63-142660 | 6/1988 | Japan . |  |
| 2-103841 | 4/1990 | Japan . |  |
| 2-179887 | 7/1990 | Japan . |  |
| 2-179888 | 7/1990 | Japan | 156/644 |

*Primary Examiner*—William A. Powell
*Attorney, Agent, or Firm*—Ostrolenk, Faber, Gerb & Soffen

[57] ABSTRACT

A method of forming small through-holes in a thin metal layer including the steps of forming resist films having openings formed in accordance with a predetermined pattern; etching one or both sides of the thin metal plate and stopping etching before through-holes are formed; removing the overhang of the resist film by spraying high pressure fluid onto the etched side of the thin metal plate; covering the surface by an etch-resisting layer; forming through-holes by etching the side not covered; and stripping the etch-resisting layer and the resist film.

32 Claims, 17 Drawing Sheets

FIG.1 PRIOR ART
FIG.3 PRIOR ART
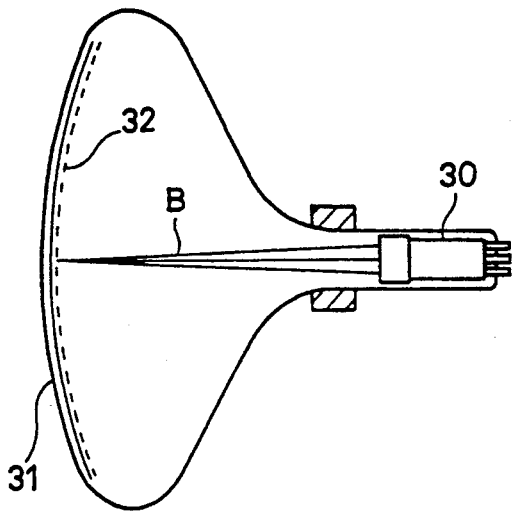
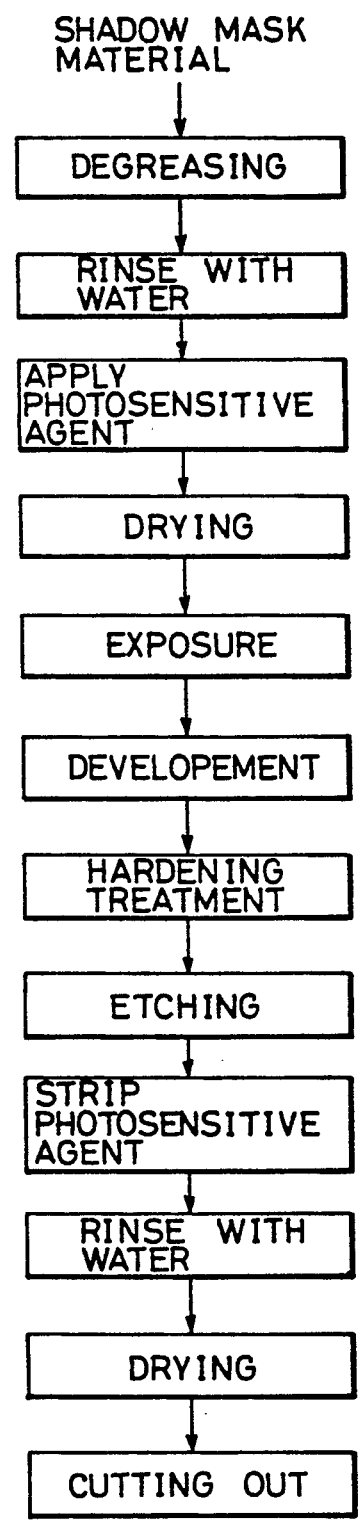
FIG.2 PRIOR ART
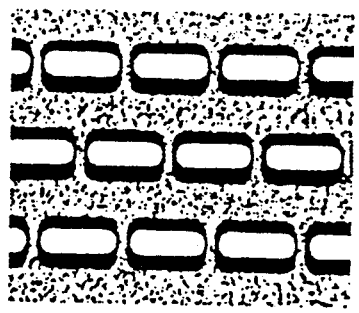

METHOD OF FORMING SMALL THROUGH-HOLES IN THIN METAL PLATE

BACKGROUND OF THE INVENTION

1. Field of the Invention

The present invention relates generally to a method of forming through-holes in a thin metal plate by means of etching, and more specifically, to a method of forming small through-holes in a thin metal plate by etching the thin metal plate from its both sides for use in manufacturing a shadow mask for a color CRT (Cathode Ray Tube), etc.

2. Description of the Related Art

Color CRT'S are now in wide use as computer displays or monitoring units, etc. in addition to its long standing use as a color television receiver tube for general television broadcasting. With such a variety of uses, extremely high definition picture qualities are required.

A color CRT includes, as shown in FIG. 1, an electron gun 30 for producing three electron beams B, phosphors 31 for receiving the electron beams B produced by the electron gun 30 and emitting light of three primary colors, and a shadow mask 32 disposed between the phosphors 31 and the electron gun 30 and provided with a number of through-holes (see FIG. 2) for selectively passing an electron beam B running in a desired direction. Those electron beams which run in undesired directions impinge upon the shadow mask 32 and do not reach the phosphors 31.

As described above, high resolution is required especially for a color CRT used in a display unit or a monitor (hereinafter referred to as "high resolution TV tube"). A shadow mask for use in a high resolution CRT must have small through-holes of substantially the same shape. High resolution can not be obtained unless the through-holes are small enough. Diversity in the shapes of the through-holes can be responsible for degradation in picture quality.

A shadow mask is generally manufactured by a process including the steps shown in FIG. 3. More specifically, a low carbon aluminum-killed steel plate having a thickness in the range of about 0.1 to 0.3 mm, or a piece of Invar alloy (ferric-nickel alloy containing 36% of nickel) is prepared as a base plate. The surface of the base plate is degreased and rinsed with water. Then, a photosensitive agent is applied onto both sides of the base plate and dried, and a photoresist film having a thickness of several μm, is formed on each side of the base plate.

Masks are put into contact with the surfaces of the photoresist films on both sides of the base plate. The mask is prepared by forming a desired image pattern on a surface of a transparent plate of, for example, glass. The masks on both sides of the base plate are registered so that the positions of their picture images correspond to each other.

The photoresist film covered by the mask is exposed to light causing a chemical reaction to take place in the exposed part. The photoresist film is developed after the exposure and harden. Resist films having openings formed in accordance with the desired image pattern are formed on the top and bottom side surfaces.

The base plate is subject to spray-etching using ferric chloride aqueous solution. The metal part of the shadow mask material exposed and not covered by the resist films is removed, and a number of through-holes having a desired shape are formed in the base plate. The resist films are stripped from the front and rear surface of the base plate after the etching is completed. After the base plate is rinsed with water and dried, it is cut out into a prescribed shape. The desired shadow mask is thus obtained.

Through-holes having a diameter smaller than the thickness of a shadow mask material are often produced for a shadow mask used in a high resolution CRT. A circular through-hole having a diameter of about 145 μm is produced in a plate material having a thickness of about 0.2 mm in some cases. In other cases, for example, in the case of an aperture grill used in a CRT of TRINITRON ® (a registered trademark by SONY CORPORATION) type, a long hole having a width of about 75 μm is formed in a plate material having a thickness of about 0.1 mm.

Consider that a shadow mask sized as such is fabricated by forming through-holes through only a single etching process. In this case, it is empirically well known that it is extremely difficult to form through-holes having a desired shape resulting in a shadow mask which can not be used in practice.

A solution to this problem is proposed, for example, in U.S. Pat. No. 3,679,500 or Japanese Patent Publication No. 57-26345. Those documents provide a method of forming through-holes by means of first and second etching processes as shown in FIG. 4.

Now, referring to FIG. 4, after the first etching process is completed, the surfaces of a shadow mask material are covered with etch-resisting layers. The covered part is protected against a subsequent second etching process. The first approach of these suggestions will be described in conjunction with FIGS. 4A to 4G.

As shown in FIG. 4A, a thin metal plate (a shadow mask) 1 having its front and rear surfaces covered respectively with resist films 2, 2' with a desired image pattern is prepared by the steps as far as "hardening treatment" in FIG. 3.

Referring to FIG. 4B, etching agent (ferric chloride aqueous solution) 4 is sprayed from a spray nozzle 3 to one side of the thin metal plate 1. The exposed part of the one side of the thin metal plate is etched, and recesses 5 having the shape shown in FIG. 4C develop. This is "the first etching treatment."

Referring to FIG. 4C, etching is stopped before the recesses 5 reach the other side of the thin metal plate 1. The thin metal plate 1 is rinsed with water and dried.

Referring to FIG. 4D, an etch-resisting layer 6 formed of, for example, paraffin, asphalt, lacquer, UV light hardening type resin, etc. is formed entirely over the one side of thin metal plate 1. The layer 6 is formed using a spray or a roll coater.

Now referring to FIG. 4E, the etching agent 4 is sprayed from a spray nozzle 3' onto the other side of thin metal plate 1. A recess 7 shown in FIG. 4F develops from the other side of thin metal plate 1 toward the side of the front surface by this treatment, and the recesses 5 and 7 come into communication. This step corresponds to "the second etching treatment."

Referring to FIG. 4G, after etching is completed, the resist films 2, 2' and the etch-resisting layer 6 are stripped off. A number of through-holes 8 are left in the thin metal plate 1. The through-holes are formed by etching the same metal plate 1 twice from the front and the rear sides of the plate. As compared to the case in which the through-hole 8 is formed by a single etching process, the etchant does not pass the through-holes in accordance with this method, thereby preventing the diameter of the through-hole 8 from widening inappropriately.

FIGS. 5A to 5G show a variation of the method shown in FIGS. 4a to 4g. The method shown in FIGS. 5A to 5G is substantially identical to the one shown in FIGS. 4A to 4G except that the first etching treatment is conducted on both sides of the thin metal plate 1 as shown in FIG. 5C. The etching treatment is completed before the recesses 5, 5' formed by the process communicate with each other.

Referring to FIG. 5D, the entire surface of one side is covered by the etch-resisting layer 6. As shown in the figures after FIG. 5E, the treatment identical to the one after FIG. 4E is conducted, and a number of through-holes 8 shown in FIG. 5G are formed in the thin metal plate 1.

In FIGS. 4A to 4G, and FIGS. 5A to 5G, the same reference characters and reference numerals denote the same or corresponding portions. Therefore, detailed description in conjunction with FIGS. 5A to 5G will not be repeated here.

The above-described conventional methods have the following shortcomings. As shown in FIGS. 4C and 5C, the recesses 5 develop not only in the direction of the thickness of the thin metal plate 1 but also in the direction parallel to its surface. Consequently, the recesses 5 expand beyond the circumferences of the openings in the resist film 2. In other words, the resist film 2 slightly protrudes from the circumferential edge of the recesses 5 toward the center of the recesses 5. This protruding part of the resist film 2 is hereinafter called "overhang."

As shown in FIGS. 4D or 5D, an etch-resisting layer 6 is formed on the resist film 2. However, in this process, a void 10 may be formed beneath the overhang 9 as shown in FIG. 6.

The surface of the thin metal plate 1 in the boundary with this void 10 can not be covered by the etch-resisting layer 6. At the time of the second etching, the etching agent enters into the void 10 when the recess 7, developing from the bottom, and the void 10 come into communication. As a result, the thin metal plate 1 is etched in the boundary with the void 10, thereby expanding the size of the recess 5 in that part. It is therefore not possible to form small through-holes shaped as desired, rendering the resultant shadow mask defective.

A method for solving such a problem is disclosed in Japanese patent Laid Open No. 59-73834, which includes the steps of removing a resist film on the side to be provided with an etch-resisting layer from the surface of a thin metal plate after the first etching process, and forming the etch-resisting layer on the surface with that resist film removed.

However in accordance with this method, at the time of the removal of the resist film after the first etching process, the resist film on the opposite side must be protected by a sheet, etc. so that the resist film on the opposite side will not be removed. A protective sheet must therefore be prepared. Devices for attaching or removing the sheet will also be necessary. Furthermore, a cleaning device will be necessary in addition to a device for removing a resist film, when the resist film is removed by spray of, for example, alkaline liquid. The shadow mask manufacturing device as a whole will be oversized accordingly, and a number of devices will be necessary, complicating the operation of the device.

A method is disclosed in Japanese Patent Laid Open No. 61-130492, which includes the steps of removing only the overhang of a resist film after the first etching process by bathing an entire thin metal plate in ultrasonic wave and then forming an etch-resisting layer. The void can be prevented in accordance with this method.

However, this method bears several problems. That is, a small quantity of etching agent remains within a very small recess formed in a thin metal plate after the first etching process. It is almost impossible to completely remove the remaining etching agent by means of normal cleaning. The very small recess is corroded by the remaining etching agent and expands while the thin metal plate is bathed in ultra-sonic wave. Ultra-sonic wave capable of cutting off the overhang of a resist film, when applied to a thin metal plate, can give rise to mal-adhesion between the thin metal plate and the resist film. The part other than desired to be etched will be etched in the second etching process due to this mal-adhesion state, and this will be another reason for rendering the shadow mask defective.

SUMMARY OF THE INVENTION

It is therefore an object of the present invention to provide, in a method of forming a number of through-holes in a thin metal plate through two etching processes, a method of removing the overhang of a resist layer produced by the first etching process while maintaining good adhesion between the thin metal plate and the resist layer.

Another object of the present invention is to remove the overhang of a resist layer by simple steps while maintaining good adhesion between a thin metal plate and the resist layer.

A further object of the present invention is to remove the overhang of a resist layer by a process other than ultrasonic wave bathing.

Yet another object of the present invention is to remove the overhang of a resist layer by reduced steps.

A still further object of the present invention is to provide a method of removing the overhang of a resist layer and cleaning the surface of a thin metal plate simultaneously, after the first etching process.

An additional object of the present invention is to provide a method of removing the overhang of a resist layer without post-treatment.

An additional object of the present invention is to remove the overhang of a resist layer without adversely affecting human bodies and environment.

An additional object of the present invention is to provide a method of efficiently removing all the overhangs of a resist layer on the surface of a thin metal plate.

A method in accordance with the present invention is directed to the formation of small through-holes in a thin metal plate having front and rear surfaces. The method includes a step of forming corrosion-resistant films having a plurality of openings formed in accordance with a set of patterns corresponding to each other on the front and rear surfaces of a thin metal plate, for exposing the front and rear surfaces; and a first etching step for etching the thin metal plate exposed by the openings in the corrosion-resistant film formed on the front surface to the extent that a recess formed by the etching does not reach the rear surface. Side etching in the first etching step sometimes causes the size of the recess on the front surface to be larger than the opening formed in the corrosion-resistant film. The method further includes the steps of removing at least that part of the corrosion-resistant film which protrudes over the recess by spraying fluid substance onto the front surface in which the recesses are formed at a spraying pressure larger than a predetermined pressure; covering the front surface and the overlying corrosion-resistant film by an etch-resisting layer; a second etching step for etching the rear surface exposed by the openings of the corrosion-resistance film until the etched rear surface comes into communication with the recess formed in the first etching step; and stripping the etch-resisting layers and the corrosion-resistant films formed on the front and rear surfaces.

According to the method, after the first etching step, the fluid substance is sprayed onto the front surface of the thin metal plate etched by the first etching step at a spraying pressure more than a predetermined pressure. The thin metal plate beneath the circumferential edges of the openings of the corrosion resistant films has been etched in the first etching step. The overhangs of the corrosion-resistant films are formed in these portions, and at least these overhangs are cut off from the corrosion-resistant films by physical impact given by the fluid substance. Even if an etch-resisting layer is formed on the surface of the thin metal film and the corrosion-resistant film in a subsequent step after the removal of the overhangs, voids are unlikely to be formed anywhere. In the second etching step the thin metal plate will not attain an undesired shape in the part with the voids. Consequently, very small through-holes can be accurately formed in the thin metal plate.

In accordance with another aspect of the present invention, fluid substance is shot from a nozzle, etc. and impinges upon a thin metal plate, and the relative position between the nozzle and the thin metal plate is changed. It is therefore possible to spray the fluid substance entirely over the thin metal plate, so that at least the overhangs of the corrosion resistant films can be removed from the entire surfaces of the thin metal plate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a view schematically showing a color picture tube;

FIG. 2 is an enlarged view showing the surface of a shadow mask;

FIG. 3 is a diagram showing a general manufacturing process of a shadow mask;

DETAILED DESCRIPTION OF PREFERRED EMBODIMENTS

When a shadow mask is manufactured in accordance with the present invention, for example, the steps of manufacture are identical to the steps shown in FIG. 3 except for the etching steps. Among the steps shown in FIG. 3, the steps other than etching can be implemented in a totally identical manner as conventionally practiced. Only the etching steps are replaced with the process in accordance with the present invention. Therefore, a detailed description will be provided only with respect to the etching process of a method in accordance with the present invention.

Figure 4:
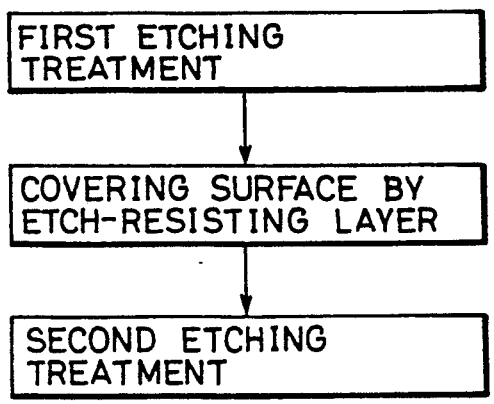
FIG. 4 is a diagram showing a process of forming through-holes in a thin metal plate by two etching processes.
Figure 8:
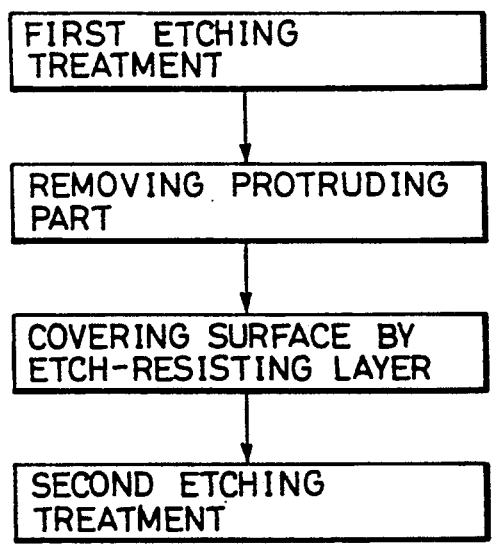
FIG. 8 is a diagram showing the essence of a method in accordance with the present invention.
Figure 8A:
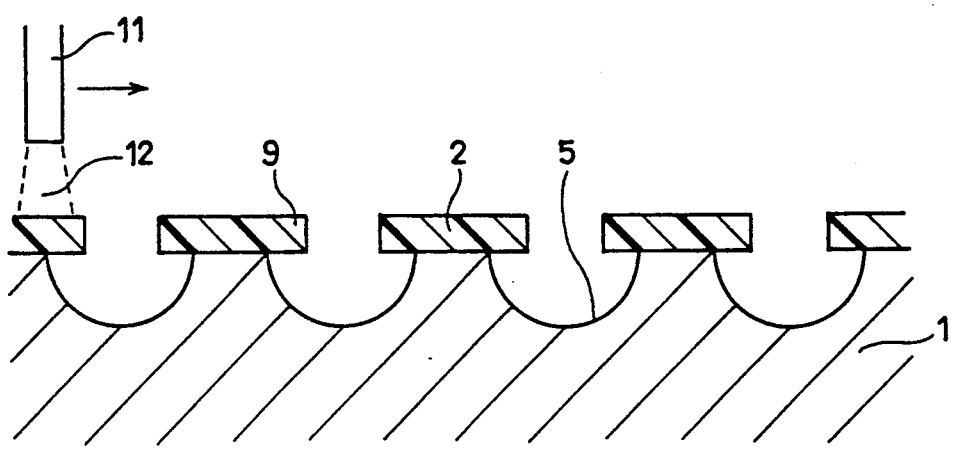
FIGS. 8A to 8C are partially enlarged sectional views each showing a thin metal plate for illustrating the essence of a process of a method in accordance with the present invention.
Figure 8B:
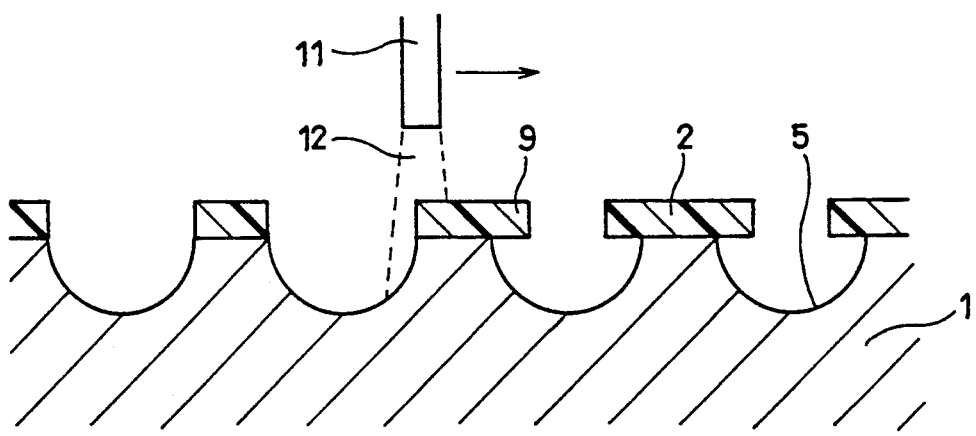
Figure 8C:
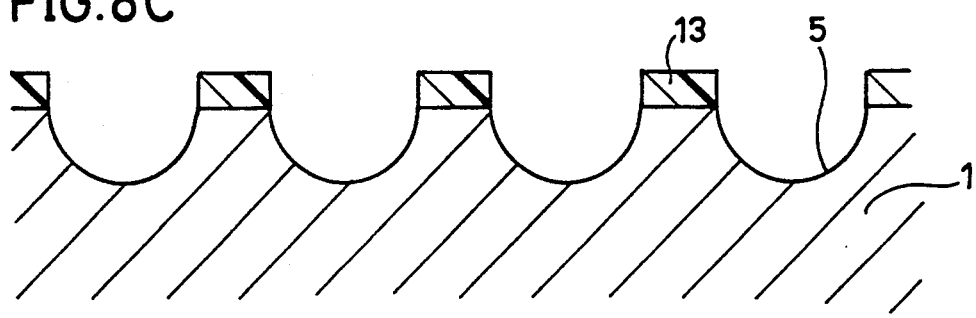

Referring to FIG. 8A through 8C, an etching process in accordance with a method of the present invention includes a first etching treatment, an overhang removing treatment using fluid substance, covering the surface of a thin metal plate with an etch-resisting layer after the overhang is removed, and second etching treatment. As can be apparent from a comparison of FIGS. 4A through 4G and 8A through 8C, the method according to the present invention is characterized by the step of removing the overhang of a resist layer by spraying a fluid substance onto the surface of a metal plate after the first etching treatment and prior to the formation of an etch-resisting layer.

Figure 4A:
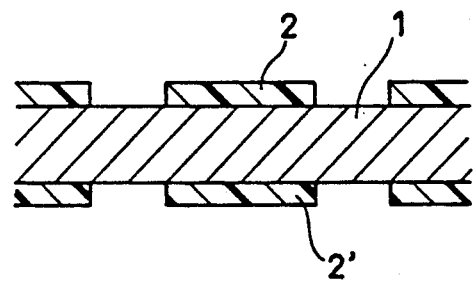
FIGS. 4A to 4G are sectional views showing a thin metal plate and films formed on both sides thereof in accordance with a process of forming through-holes by two etching processes.
Figure 4B:
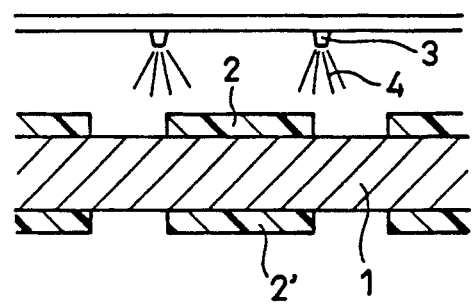
Figure 4C:
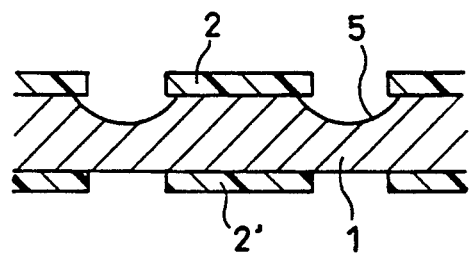
Figure 4D:
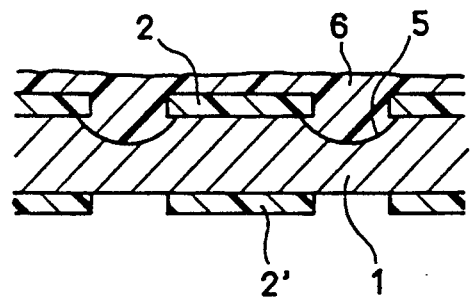

The step of removing the overhang of the resist film, for example, can be carried out between the step shown in FIG. 4C and the step shown in FIG. 4D. Alternatively, the step of removing the overhang can be carried out between the step shown in FIG. 5C and the step shown in FIG. 5D. The process shown in FIGS. 4A to 4G and the process shown in FIGS. 5A to 5G can be applied to a method in accordance with the present invention with the exception that the step of removing an overhang is inserted and the overhang is removed thereafter. The same characters and reference numerals denote the same or corresponding elements to the elements shown in FIGS. 4A to 4G, and FIGS. 5A to 5G hereinafter, and a detailed description will not be given on the steps other than the step of removing the overhang.

Referring to FIG. 8A, a thin metal plate 1 having a resist film 2 formed on its surface is prepared. Formed on the surface of the thin metal plate 1 are recesses 5 produced by a preceding first etching step. Parts of the resist film 2 protrude onto the circumferential edge of the recesses 5, forming overhangs 9. A high pressure spraying nozzle 11 is provided a prescribed distance from the surface of the thin metal plate 1. The nozzle 11 is oriented so that its center axis intersects the surface of the thin metal plate 1 at a right angle, and is capable of moving relative to the thin metal plate 1 in the direction parallel to the surface of the thin metal plate 1.

Referring to FIG. 8B, as the nozzle 11 moves laterally, a fluid substance is blown from the nozzle 11 and removes the overhangs 9.

Referring to FIG. 8C, the nozzle 11 has passed over the plate 1, the overhangs are removed, and a resist film 13 having no overhangs remains. The recess 5 is entirely exposed. An etch-resisting layer (not shown) is then formed over the entire resist film 13 and the recess on the surface of the thin metal plate 1. As can be seen from FIG. 8C, there is no possibility of a void occurring in the recesses 5. Therefore, it is most unlikely that through-holes will be formed in an undesired manner in the subsequent second etching treatment.

As shown in FIGS. 8A to 8C, one or more high pressure spray nozzles 11 are maintained a certain distance apart from the surface of the thin metal plate 1. Furthermore, the high pressure spray nozzles 11 move relative to the thin metal plate 1 in the direction parallel to the surface of the thin metal plate 1. Thus, the high pressure fluid substance is sprayed entirely over the surface of the thin metal plate 1, and the overhangs are entirely removed. Alternatively, an arrangement of a sufficient number of high pressure spray nozzles may be used in order to treat the entire surface of the thin metal plate 1 without the relative movement of the nozzles.

Any fluid substance may be used, which can be shot from the high pressure spray nozzle and give physical impact to the resist film. For example, liquid such as water, acid, alkaline water, various chemical agents, and organic solution, powdery grain such as ice grain, sand, titanium oxide, and quartz, or a mixture of these liquid and powdery grain may be used.

Now, description will be provided on experiments by the application of the present invention in practice and the results in conjunction with FIGS. 9 to 13 as well as a table.

Figure 9:
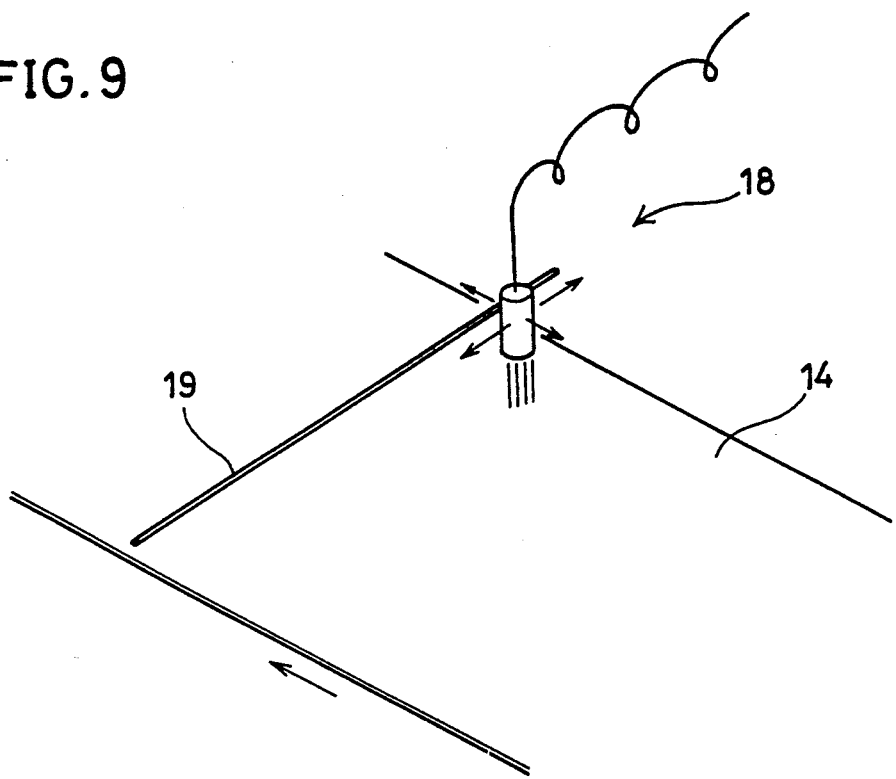
FIG. 9 is a view schematically showing the positioning and operation of a nozzle in an experiment on the present invention using one nozzle.

A web 14 of shadow mask material (low carbon aluminum-killed steel) was used as a sample, having a circular recess with a diameter of about 100 μm on its opposite surfaces, rinsed with water and dried thereafter. As shown in FIG. 9, the web 14 was fed along the front surface of a base stage (not shown), while a spray system 18 for shooting high pressure fluid substance was moved along a guide 19 in the direction intersecting the direction in which the web 14 was fed and in parallel to the front surface of the web 14. Fluid substance was shot upon the surface of the web 14 from the spray system 18. The spray system 18 thus scanned the surface of the web 14, and the fluid was sprayed in an even manner entirely on the web 14. An A7A type airless automatic gun manufactured by NORDSON K.K. (a Japanese Corporation) was used for the spray system 18 for shooting the high pressure fluid substance. The fluid shot was water having an ordinary temperature of 23.2° C., and the diameter of the water shot was about 2 mm$\phi$.

The speed of feeding the web 14 was 1 mm/sec, the speed of moving the spray system 18 was 400 mm/sec and the width of the web 14 was 600 mm. Experiments were made, in which the spraying pressure of the spray system 18 was changed as shown in the table, and water of ordinary temperature was ejected from a height 2 cm above the surface of the web 14 for each pressure. A FUJI FILM PRESCALE, super low two sheet type manufactured by FUJI PHOTO FILM CO., LTD. was used to measure the spraying pressure.

Then, after the step of water shooting, UV resin of about 100 cps was applied as an etch-resisting layer by a roll coater as thick as about 10 μm onto the surface of one side of the shadow mask material 14 having a plurality of recesses formed by the first etching process.

Figure 4E:
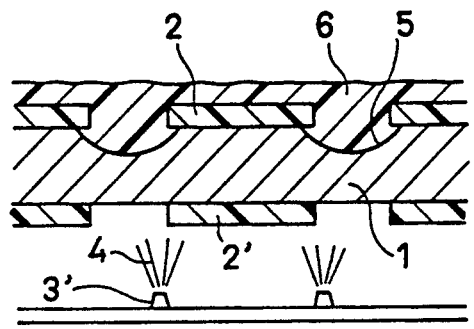
Figure 4F:
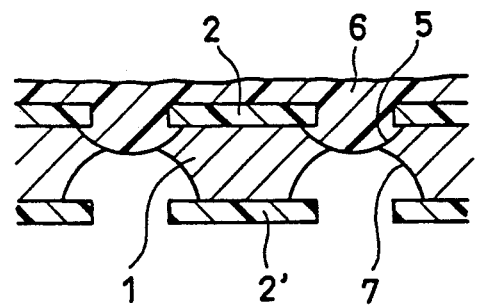
Figure 4G:
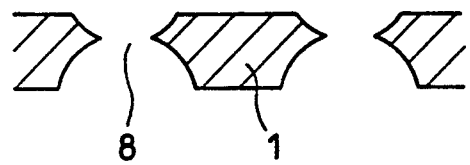
Figure 5A:
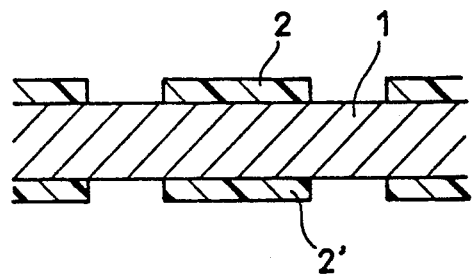
FIGS. 5A to 5G are sectional views showing a thin metal plate and films formed on both sides thereof in accordance with a process of forming through-holes by two etching processes.
Figure 5B:
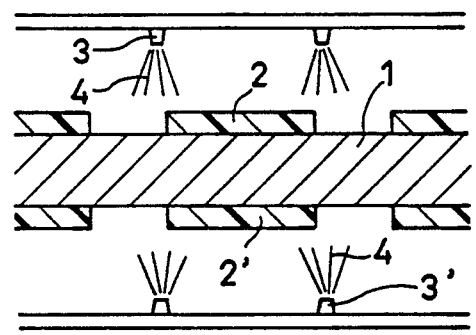
Figure 5C:
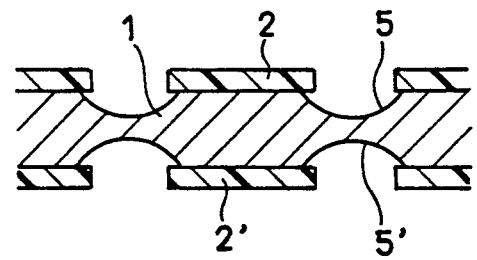
Figure 5D:
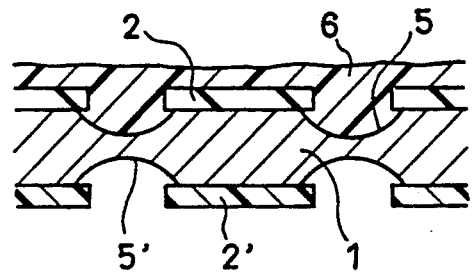
Figure 5E:
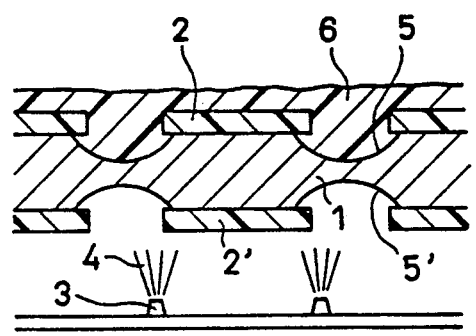
Figure 5F:
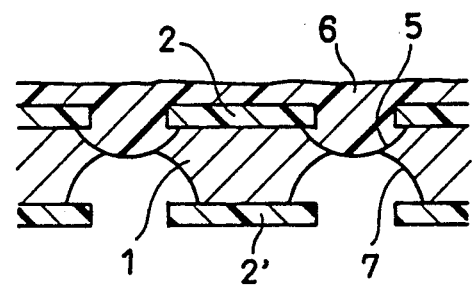
Figure 5G:
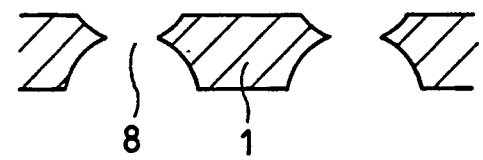
Figure 6:
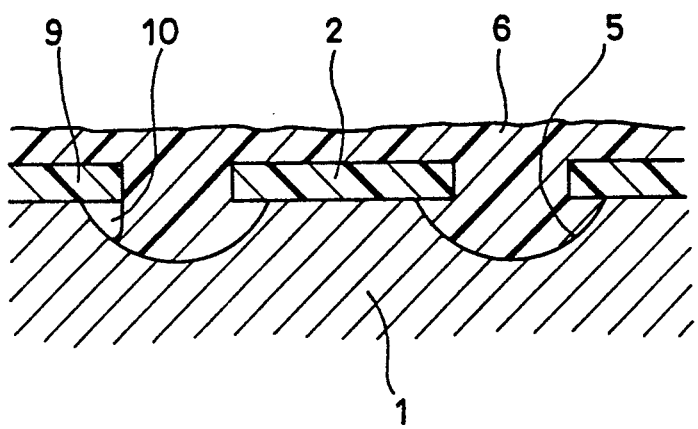
FIG. 6 is a partially enlarged sectional view showing a thin metal plate for illustrating a void.
Figure 7:
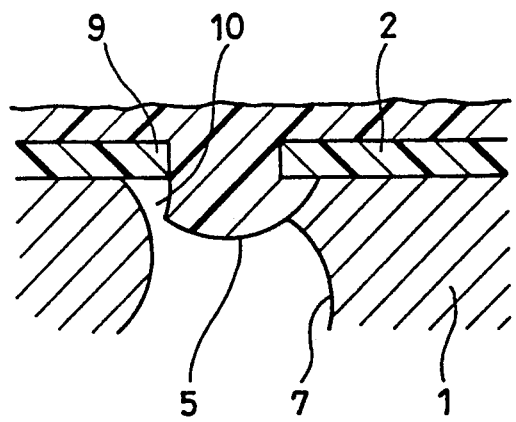
FIG. 7 is a partially enlarged sectional view showing a thin metal plate for illustrating the formation of undesirably etched portions caused by the void.

Subsequently, as shown in FIG. 4E, etching agent was sprayed from the spray nozzle onto the surface not covered by the etch-resisting layer, thereby performing the second etching. As shown in FIG. 4F, very small recesses formed on the surface and very small recesses formed by the first etching process were communicated to each other. Then, the etch-resisting layer and the resist film were stripped off from the surface of the web 14 in the order shown in the flow chart in FIG. 3. Rinsing with water and drying were conducted thereafter. Ferric chloride aqueous solution of 40° C. and 45° baumé were used in the above-described first and second etching processes.

The effect of the removal of the overhangs was evaluated by observing the surface of the web 14 with an optical microscope after the shooting. Electron microphotographs each showing the effect are in FIGS. 10 to 13.

Figure 10:
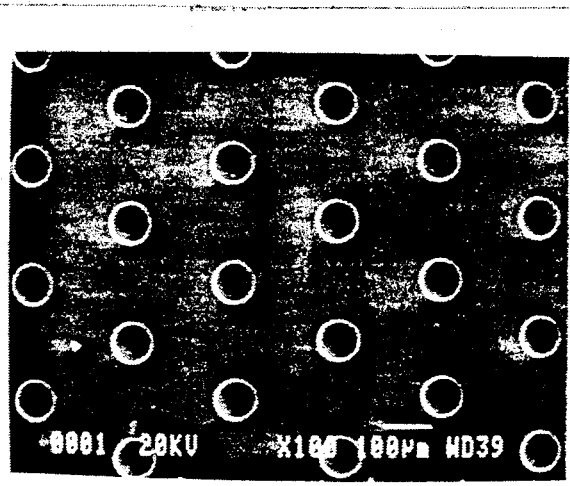
FIGS. 10 to 13 are enlarged electron microphotographs each showing the surface of a thin metal plate obtained by an experiment.
Figure 11:
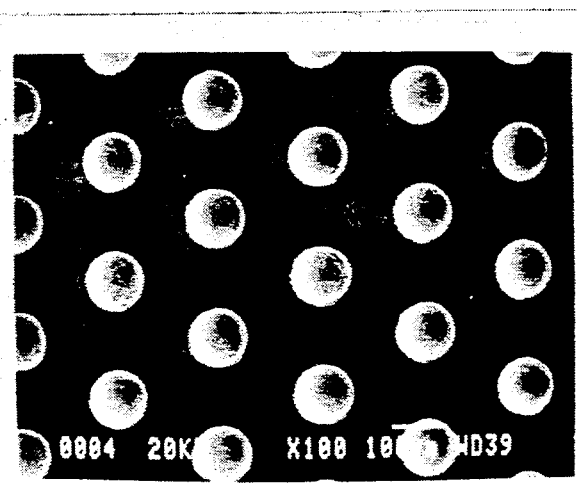

FIG. 10 shows the surface of the web 14 having a plurality of recesses as a result of the first etching process. That surface of the web 14 was as shown in FIG. 11 after the shooting process. It can be seen from FIGS. 10 and 11, that the diameter of the opening of the resist film increased after the shooting, and all of the recesses formed in the mask material 14 are exposed.

Figure 12:
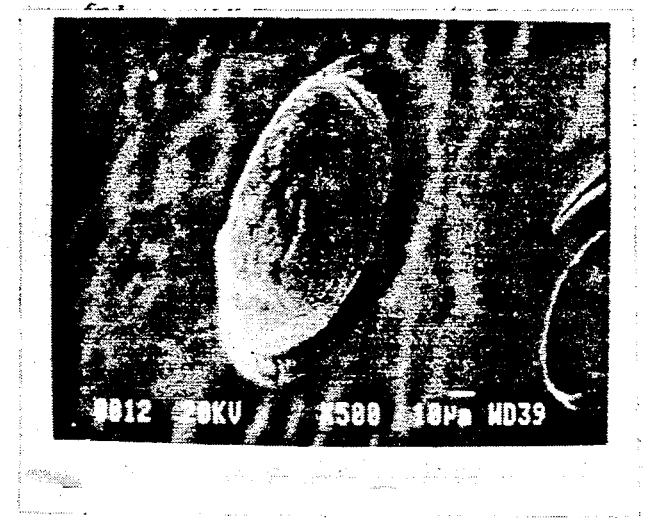
Figure 13:
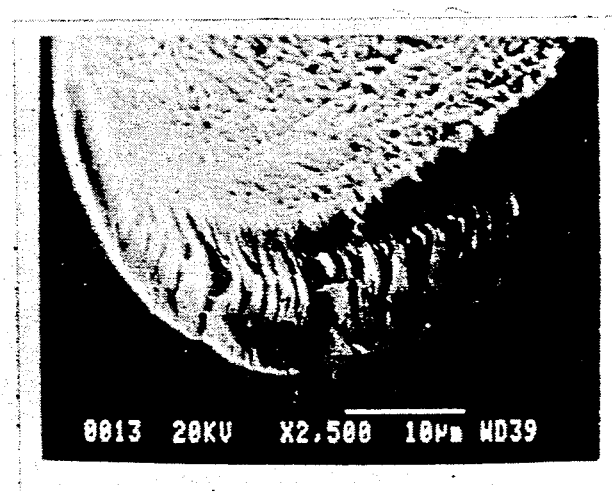

FIG. 12 and 13 are photographs enlarged by the factor of 500 and 2500, respectively, each showing the surface of the web 14 after the overhangs were removed. It can be appreciated from FIGS. 12 and 13 that both the overhangs formed by the first etching process and the resist film surrounding these overhangs were removed slightly.

As for the formation of voids, evaluation was made by determining the existence of a void by, observing the surface of the web 14 supplied with the Uv resin as an etch-resisting layer after the removal of the overhangs using an optical microscope.

The finish of the etching was evaluated by visually confirming whether apertures were formed in desired shapes in the shadow mask material 14.

Table 1 represents evaluations on the removal of the overhangs, the presence or absence of a void, and the finish of etching as to different values for the spraying pressure from the nozzle under the above-described conditions.

TABLE 1

| Spraying Pressure kg/cm²G | 2 | 4 | 6 | 8 | 10 | 15 | 30 | 60 | 100 | 110 | 120 | 150 | |
|---|---|---|---|---|---|---|---|---|---|---|---|---|---|
| Effect of Removal of Overhang | X | X | X | X | O | O | O | O | O | O | O | O | O: Completely Removed X: No Removal/Incomplete |
| Presence or Absence of Void | X | X | X | X | O | O | O | O | O | O | O | O | O: Absent X: Exist |
| Finish of Etching | X | X | X | X | O | O | O | O | O | O | O | O | O: Good X: Poor |

It can be appreciated from the above-described results of the experiments that very small through-holes having a desired shape can be formed by setting the spraying pressure of the spray system 18 for high pressure fluid substance spraying to be more than 10 kgf/cm², for example, 15 kgf/cm². This is because the overhangs of the resist film were entirely removed by the fluid sprayed at a sufficiently high pressure, and, therefore, voids could not be formed when the recesses were covered by the etch-resisting layer.

Conventionally, it has been commonly recognized that the water pressure in the step of rinsing with water conducted subsequent to the etching must be low, for example, as low as 0.5 to 1.5 kgf/cm². It had been believed that otherwise (1) the resist film would partially come off, (2) mal-adhesion between a resist film and a thin metal plate would take place due to cracks formed in the resist film, or (3) the thin metal plate itself would break.

Rejecting the foregoing assumptions, the inventors herein determined by experimentation that overhangs could be successfully removed by applying high pressure fluid substances.

In these experiments, the removal of the overhang as described above was conducted immediately after the first etching treatment shown in FIG. 8 and immediately before the surface of the web was covered by the etch-resisting layer. The present invention however is by no means limited thereto, but any appropriate method may be employed for the removal of the overhang between the first etching treatment and the drying step before the formation of the etch-resisting layer.

Figure 13A:
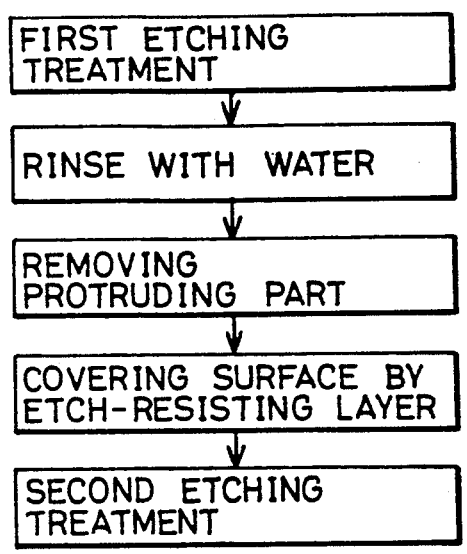
FIG. 13A is a diagram showing the essence of a process in accordance with another embodiment of the present invention.
Figure 13B:
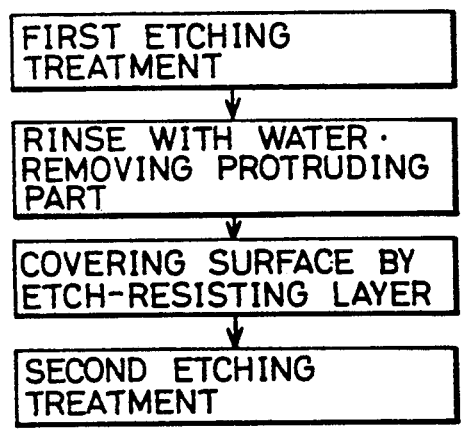
FIG. 13B is a diagram showing the essence of a process in accordance with another embodiment of the present invention.
Figure 24:
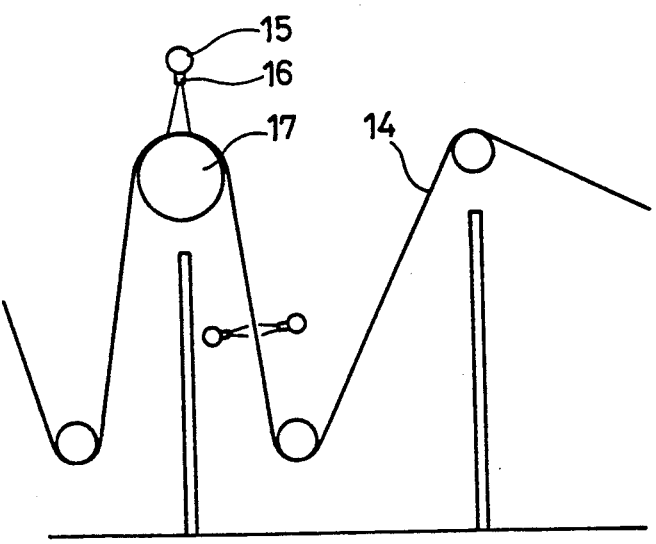
FIG. 24 is a schematic view showing an operation of rinsing the shadow mask material in accordance with another embodiment of the invention.

For example, referring to FIG. 13A, the overhang may be removed in a separate step after the surface of the shadow mask material is rinsed with water subsequent to the first etching treatment. In this case, sprayed water, etc. can be recycled and used repeatedly for the removal of the overhang, because the surface of the thin metal plate is clean. Another possible method is to remove the overhangs in the step of rinsing with water after the first etching process is completed. In this case, water sprayed from the spray nozzle of a rinsing device is utilized for the removal of the overhang as well, and, therefore, no device dedicated to the purpose of the removing the overhangs will be necessary. As the case may be, the step of rinsing with water may be added subsequent to the removing step for the purpose of expelling cut away resist film. When performing such rinsing, preferably, water is sprayed from the spray nozzles not only to the front surface of the shadow mask material alone but also to the front and rear surfaces thereof alike as illustrated in FIG. 24, in order to prevent any scums of the overhangs cut on the front surface from adversely going round to the rear surface.

In the experiment, no deformation of the web of shadow mask material due to the water pressure at the time of high pressure water spraying was observed. Now, to be more careful, high pressure water, etc. may be sprayed to the front surface of the thin metal plate by supporting the thin metal plate on a stage and moving the front surface. Alternatively, the high pressure water, etc. may be sprayed to the part supported by a roll by feeding the web of thin metal plate into the rotating roll. In the following, some of other embodiments in accordance with the present invention as described above will be illustrated.

Figure 14:
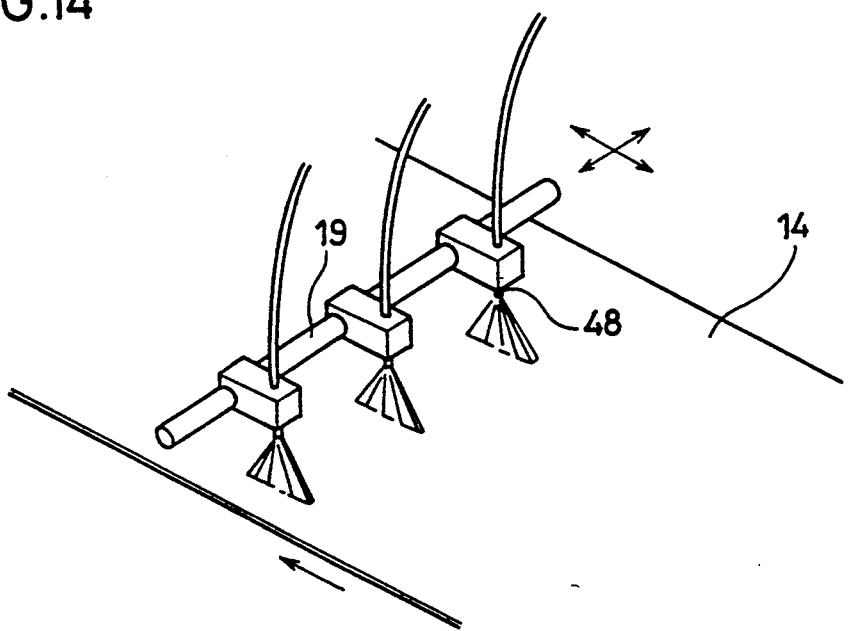
FIG. 14 is a view illustrating the positioning and operation of three nozzles in accordance with another embodiment of the present invention.

Referring to FIG. 14, the web of shadow mask material 14 after the first etching process is fed along the front surface of a base stage (not shown). Three spray nozzles 48 are provided a prescribed distance above from the surface of the shadow mask material 14. These spray nozzles 48 are moved along a guide 19 in the direction orthogonal to the direction of feeding the shadow mask material 14 and in parallel to the front surface of the shadow mask material 14. Fluid substance is sprayed in an even manner entirely on the surface of the shadow mask material 14 from the three spray nozzles 48 moving in the widthwise direction of the shadow mask material 14.

A good result was also given by implementing the present invention in a manner as shown in FIG. 14. A spray nozzle used was a nozzle (model number ¼/MVEP11519) manufactured by H. IKEUCHI & Co., LTD. The spray nozzle 48 was placed in a position 7 cm above the surface of the shadow mask material 14 and sprayed the flow of fluid substance fanwise in the range of about 8 cm in the direction of feeding the shadow mask material 14. Water of ordinary temperature was used for the fluid substance. The speed of feeding in the shadow mask material 14 was 3 m/min, and the moving speed of each of the spray nozzles 48 was more than 250 mm/sec, for example, 300 mm/sec. The spray nozzle 48 makes the reciprocating movement for 200 mm in the widthwise direction of the shadow mask material 14 at this speed. The width of the shadow mask material 14 was 600 mm. Fluid substance having a pressure of more than 10 kgf/cm² at the time of spraying, e.g. a spraying pressure of 15 kgf/cm² was sprayed onto the surface of the shadow mask material.

Figure 15:
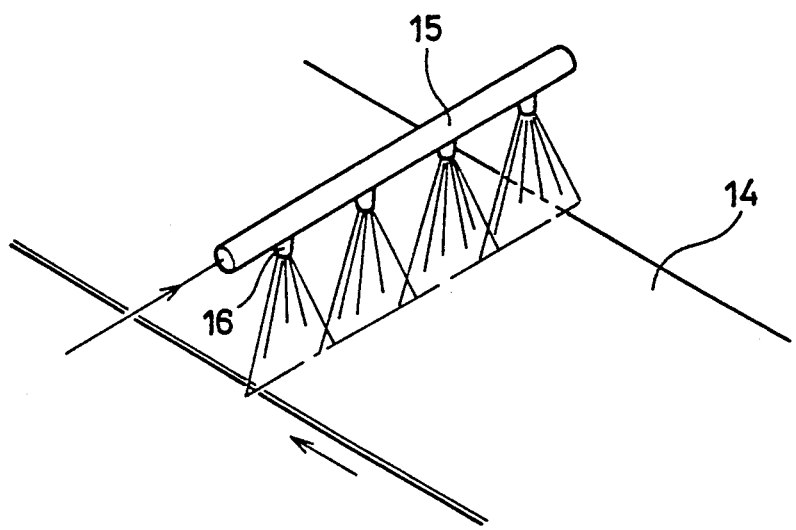
FIG. 15 is a view illustrating the placement of four nozzles in accordance with another embodiment of the present invention.

Another possible embodiment is in FIG. 15. Referring to FIG. 15, the web 14 after the first etching process was fed in a prescribed direction. A spray tube 15 was provided in the direction orthogonal to the direction of feeding of the web 14. The spray tube 15 was provided with a plurality of fixed nozzles 16. The fixed nozzles 16 discharge fluid substance toward the shadow mask material 14, and the fluid substance had an even pressure across the entire width of the web 14.

Water of ordinary temperature was used for the fluid. The spraying pressure applied to the surface of the shadow mask material 14 was determined to be more than 10 kgf/cm$^2$, for example, 15 kgf/cm$^2$. The speed of feeding of the shadow mask material 14 was determined on demand, e.g. 0.5 to 4 m/mic.

A base stage (not shown) for supporting the rear surface of the shadow mask material 14 was provided in the feeding path. The shadow mask material 14 was fed along the front surface of the stage.

Figure 16:
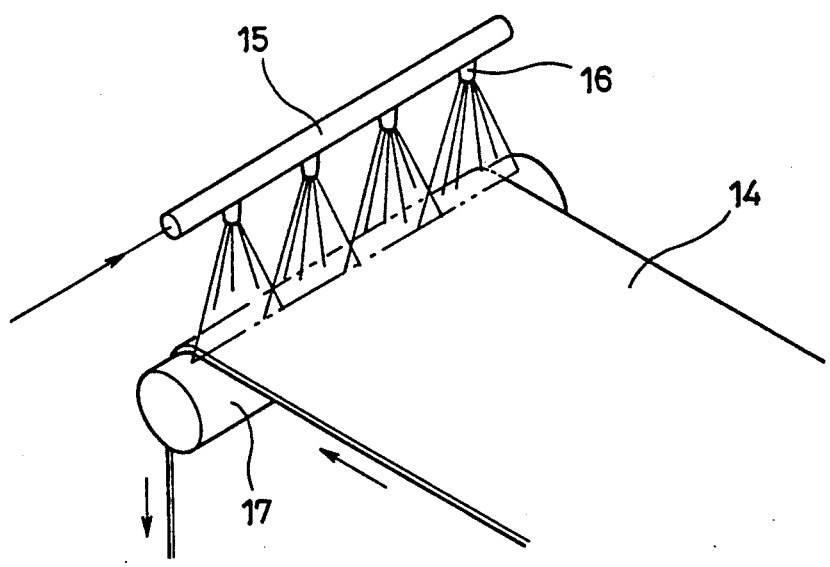
FIG. 16 is a view illustrating the placement relation between a roller for supporting a thin metal plate and nozzles in accordance with another embodiment of the present invention.

FIG. 16 shows an example in which a rotating roller 17 was provided in the path instead of the stage, for supporting the rear surface of the web 14. Water of ordinary temperature was shot from the nozzles 16 of the spray tubes 15 to the part supported by the rotating roller 17.

Figure 23A:
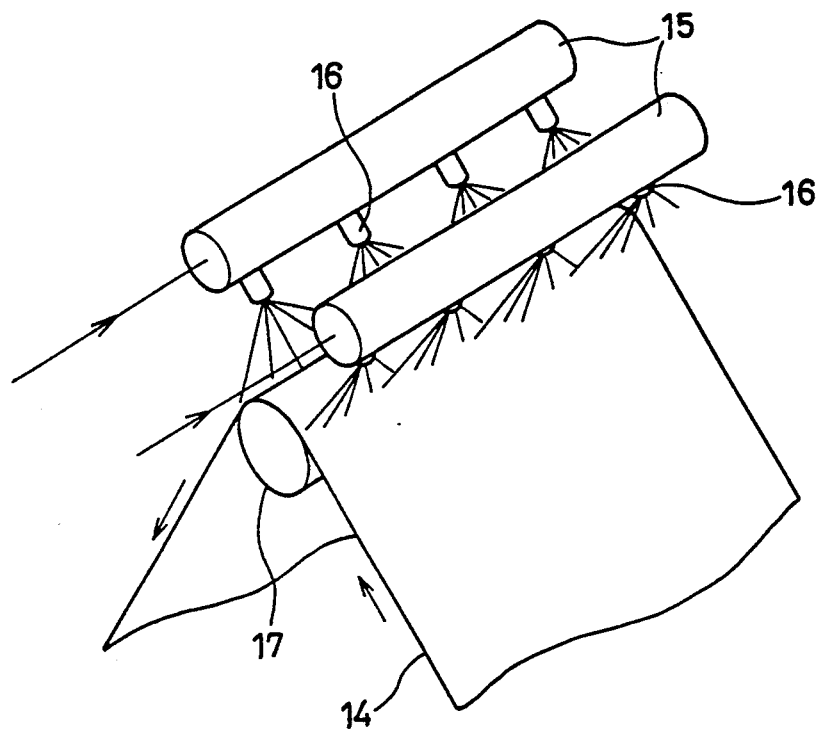
FIG. 23A and 23B are schematic views illustrating the placement of plural spray tubes in accordance with another embodiment of the invention.
Figure 23B:
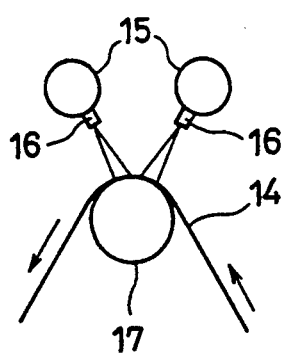

Either a roller covered by rubber or a metal roller may be used for the rotating roller 17. The spraying pressure as well as the speed of feeding the shadow mask material 14 should be identical to the above-described conditions. Further, as shown in FIGS. 23A and 23B, two spray tubes 15 may be provided, being juxtaposed with respect to each other and extending orthogonally to the fending direction of the shadow mask material 14, so that two-staged fluid substance discharging can be conducted. Needless to say, three spray tubes 15 or more may be provided as well for three-staged discharging or more.

Good results were obtained for all of the above-described cases.

In the above-described experiments, as well as the embodiments incorporating the step of spraying high pressure fluid substance, the cases have been described in which a circular shaped recess is produced. However, the present invention is not limited to forming of through-holes of this shape. The present invention can be applied to the case in which, for example slot shaped through-holes as illustrated in FIG. 2 are produced in a web. A CRT part called an aperture grill similar to a shadow mask can be manufactured by the application of the present invention.

Figure 17:
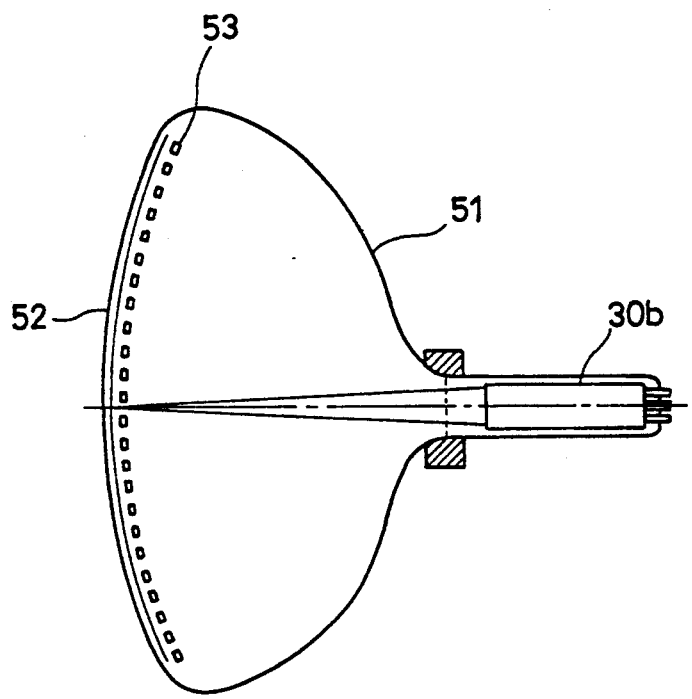
FIG. 17 is a sectional view schematically showing a picture tube with an aperture grill incorporated therein.
Figure 18:
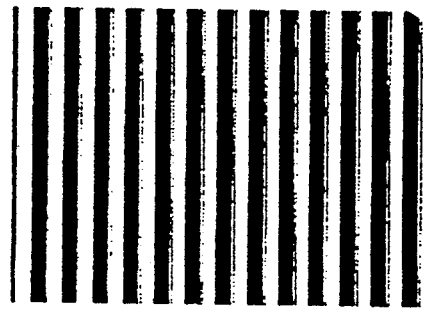
FIG. 18 is a partially enlarged view showing the surface of an aperture grill.

Referring to FIG. 17, the aperture grill is used in a TRINITRON (a trademark by Sony Corporation) type CRT manufactured by SONY CORPORATION. The trinitron type CRT includes an electron gun 30b provided in a glass tube 51, and an aperture grill 53 provided close to the phosphors 52 of the glass tube 51. The aperture grill 53 includes a thin metal plate in which a plurality of slots are formed as shown in FIG. 18. The slot is provided for passing an electron beam in a desired direction. Electron beams which run in undesirable directions impinge upon the thin metal place and will not reach the phosphors 52.

The present invention can be applied for forming the plurality of small slots in the aperture grill. More specifically, it is only required to change the exposure patterns to be formed from the formation of round through-holes, and, therefore detailed description will not be given on the manufacturing process of the aperture grill.

Figure 19:
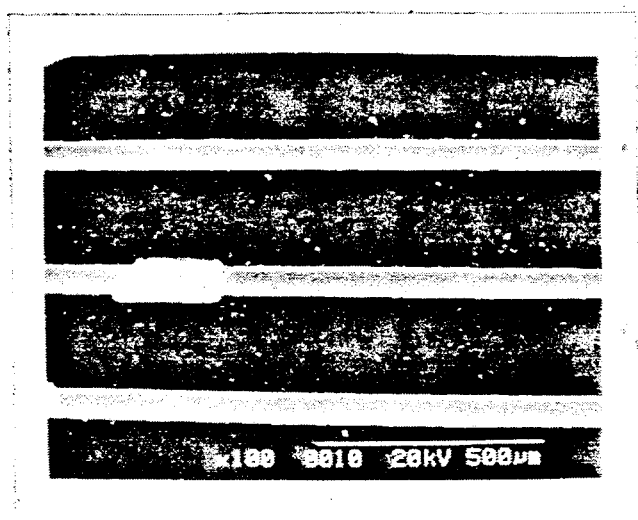
FIGS. 19 to 22 are partially enlarged photographs showing the surface of a thin metal plate in the steps of manufacturing an aperture grill in an experiment conducted in accordance with the present invention.

FIGS. 19 to 22 each illustrates the result of an experiment of manufacturing an aperture grill in accordance with the present invention. As shown in FIG. 19, and more specifically in FIG. 20, a plurality of thin long grooves are formed on one side of a thin metal plate by the first etching process. The thickness of the thin metal plate was 0.1 mm, and the width of etched groove was about 65 $\mu$m.

Figure 20:
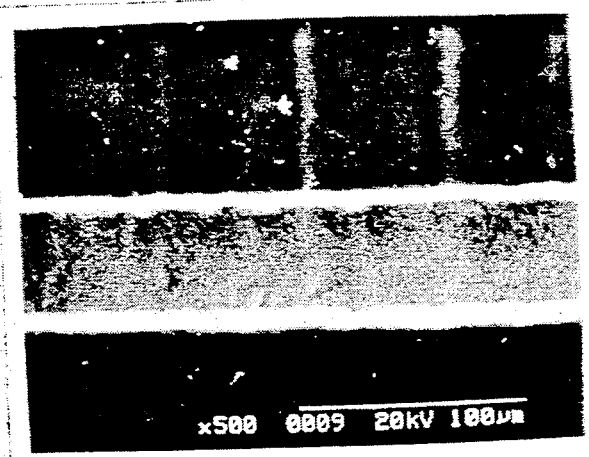
Figure 21:
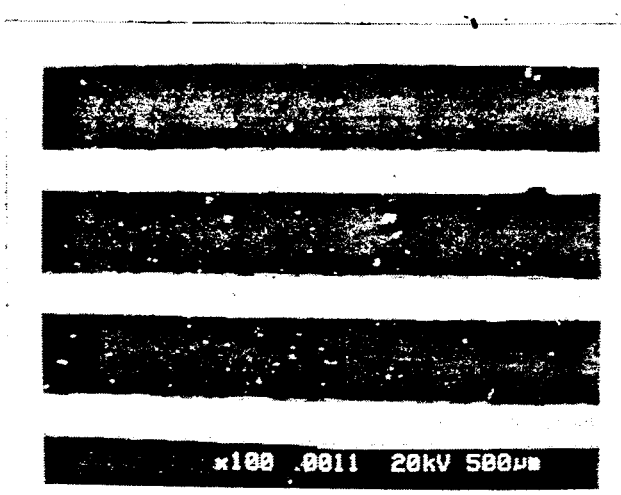
Figure 22:
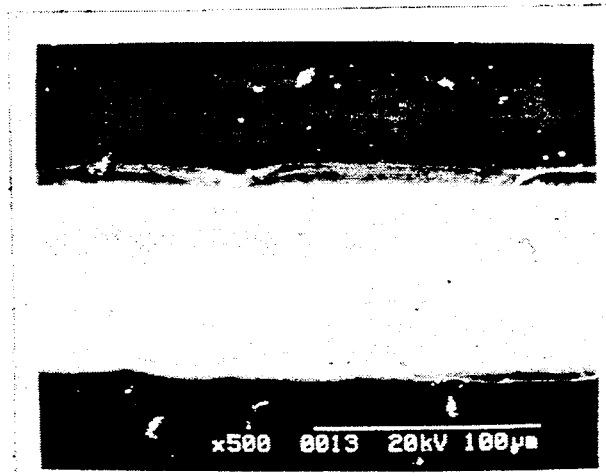

The surface of the thin metal plate shown in FIGS. 19 and 20 after being subject to treatment in accordance with a method of the present invention becomes as shown in FIG. 21, and in more detail in FIG. 22. It will be apparent from comparison between FIGS. 19 and 20, and FIGS. 21 and 22 that the overhangs of the resist film left behind on both sides of the groove were removed by the treatment in accordance with a method of the present invention.

When an aperture grill was fabricated in accordance with a method of the present invention, the grill contained even shaped slots of high quality.

Although in the above-described embodiments, the cases have been described in which the present invention is applied to the manufacturing of a shadow mask for a color picture tube, the present invention is not limited thereto, and can be applied to the step of etching perforation in manufacturing precision electronic parts such as a lead frame, etc. for, for example, electrically connecting a semiconductor element to external associated circuitry.

As the method will be readily understood by those skilled in the art by the illustration of the above-described embodiments, therefore, detailed description thereon will not be provided herein.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming small through-holes in a thin metal plate having first and second opposed surfaces, said method comprising the steps of:

forming a corrosion-resistant film on said first surface, said corrosion-resistant film having a plurality of openings formed therein;

etching said first surface of said thin metal plate through said openings of said corrosion-resistant film to form recesses in said metal plate which do not reach said second surface; the size of said recesses being larger than the size of said openings formed in said corrosion-resistant film so that portions of said corrosion-resistant film protrude over edges of said first surface which surround said recesses;

removing said protruding portions of said corrosion-resistant film by spraying a fluid substance onto said protruding portions;

covering said recesses with an etch-resisting layer;

etching said second surface to expose said recesses formed in said first surface so that a plurality of openings are formed in said plate; and stripping said etch-resisting layer and said corrosion-resisting film formed on said first surface.

2. A method as recited in claim 1, further comprising the step of rinsing said first surface of said thin metal plate with water after said first surface etching step is completed.

3. A method as recited in claim 2, wherein said removing step is carried out after said rinsing step is completed.

4. A method as recited in claim 3, further comprising the steps of collecting said fluid substance used in said removing step for use in a subsequent removing step.

5. A method as recited in claim 3, further comprising the step of again rinsing said first surface of said thin metal plate with water after said removing step is completed.

6. A method as recited in claim 1, further comprising the step of rinsing said first surface of said thin metal plate with water after said removing step is completed.

7. A method as recited in claim 1, wherein said fluid substance is water.

8. A method as recited in claim 1, wherein said openings in said corrosion-resistant film are arranged in a predetermined pattern.

9. A method as recited in claim 1, wherein said openings in said corrosion-resistant film take the form of a plurality of aperture grills arranged in parallel to each other.

10. A method as recited in claim 1, wherein said removing step comprises spraying said fluid substance from a nozzle and causing relative movement between said nozzle and said thin metal plate so that said fluid substance impinges upon substantially all of said protruding portions.

11. A method as recited in claim 10, wherein the distance between said nozzle and said first surface of said plate is kept constant.

12. A method as recited in claim 11, wherein said fluid substance is caused to impinge upon said protruding portions at an approximately constant angle.

13. A method as recited in claim 12, wherein said angle is approximately a right angle.

14. A method as recited in claim 10, wherein said second surface is supported during said removing step.

15. A method as recited in claim 14, wherein said second surface is supported by supporting means which includes a roller rotatable around a predetermined rotating axis.

16. A method as recited in claim 10, wherein said fluid substance is sprayed onto said protruding portions at a blowing pressure of more than 10 kgf/cm$^2$.

17. A method as recited in claim 16, wherein said blowing pressure is less than 150 kgf/cm$^2$.

18. A method as recited in claim 17, wherein said blowing pressure is more than 15 kgf/cm$^2$.

19. A method as recited in claim 10, wherein said removing step is carried out by causing relative movement between said nozzle and said first surface so as to first scan said first surface in a predetermined main scanning direction and then to scan said first surface in a subscanning direction which intersects said main scanning direction.

20. A method as recited in claim 19, wherein the distance between said nozzle and said first surface is kept constant.

21. A method as recited in claim 20, wherein the speed that said nozzle moves relative to said first surface is kept constant.

22. A method as recited in claim 10, wherein there are a plurality of nozzles and said fluid substance is sprayed from said plurality of nozzles.

23. A method as recited in claim 22, wherein said nozzles are provided on a spray tube extending orthogonally to a widthwise direction of said first surface.

24. A method as recited in claim 23, wherein said plurality of nozzles move relative to said first surface to scan said first surface in a predetermined scanning direction.

25. A method as recited in claim 24, wherein each of the distances between said nozzles and said first surface are kept constant.

26. A method as recited in claim 25, wherein the speed said nozzles move relative to said first surface is kept constant.

27. A method as recited in claim 25, wherein the distances between each of said nozzles and said first surface are equal.

28. A method as recited in claim 1, wherein said fluid substance is selected from the group consisting of liquid, powdery grain, and a combination of liquid and powdery grain.

29. A method as recited in claim 28, wherein said liquid is selected from the group consisting of water, acid, alkaline water, and organic solution.

30. A method as recited in claim 29, wherein said powdery grain is selected from the group consisting of ice grain, sand, titanium oxide, and quartz powder.

31. A method as recited in claim 1, wherein said step of etching said second surface to expose said recesses formed in said first surface comprises the steps of:

forming a second corrosion-resistant film on said second surface, said second corrosion-resistant film having a plurality of openings formed therein at locations corresponding to the location of said plurality of openings formed in said corrosion-resistant film formed on said first surface; and thereafter etching said second surface of said thin metal plate through said openings of said second corrosion-resistant film to form a second set of recesses in said metal plate which come into communication with respective recesses formed in said first surface of said thin metal plate so that a plurality of openings are formed in said plate.

32. A method as recited in claim 31, wherein said step of forming a second corrosion-resistant film on said second surface of said thin metal plate is carried out at the same time that said corrosion-resistant film is formed on said first surface of said thin metal plate.

* * * * *